United States Patent [19]
Doss et al.

[11] Patent Number: 5,516,418
[45] Date of Patent: May 14, 1996

[54] PATTERNED ELECTROPLATING

[75] Inventors: Saad K. Doss, Gilroy; Dennis R. McKean; Alfred F. Renaldo, both of San Jose; Robert J. Wilson, Cupertino, all of Calif.

[73] Assignee: International Business Machines Corporation, Armonk, N.Y.

[21] Appl. No.: 494,862

[22] Filed: Jun. 26, 1995

[51] Int. Cl.$^6$ .................................................. C25D 5/02
[52] U.S. Cl. ........................ 205/119; 205/122; 205/135; 205/157; 205/163; 205/165; 205/166; 205/167; 205/169; 205/186; 205/187; 205/205; 205/223
[58] Field of Search .................................. 205/119, 122, 205/157, 163, 165, 166, 167, 169, 136, 186, 187, 205, 223, 135

[56] References Cited

U.S. PATENT DOCUMENTS

| | | | |
|---|---|---|---|
| 3,523,874 | 8/1970 | Dey | 205/166 |
| 3,963,590 | 6/1976 | Deyrup | 205/167 |
| 4,279,707 | 7/1981 | Anderson et al. | 204/43 |
| 4,652,954 | 3/1987 | Church | 360/120 |
| 4,681,814 | 7/1987 | Leidheiser, Jr. et al. | 428/457 |
| 4,875,124 | 10/1989 | Dickstein et al. | 360/126 |
| 5,055,356 | 1/1991 | Minowa et al. | 428/409 |
| 5,143,884 | 9/1992 | Skoultchi et al. | 502/160 |
| 5,272,026 | 12/1993 | Roland et al. | 430/18 |

FOREIGN PATENT DOCUMENTS

| | | | |
|---|---|---|---|
| 0124899 | 7/1984 | European Pat. Off. | G03F 7/10 |
| 61-040377 | 4/1984 | Japan | C09D 5/08 |
| 1021087 | 7/1987 | Japan | C23F 11/00 |
| 01-129979 | 11/1987 | Japan | C23C 22/56 |
| 64-21087 | 1/1989 | Japan . | |

OTHER PUBLICATIONS

Nepala, D. A., "Aromatic Azo Compounds as Electrophotographic Sensitizers", IBM Technical Disclosure Bulletin, vol. 11, No. 12, May 1969.

Haines, R. S., "Magnetic Tape", IBM Technical Disclosure Bulletin, vol. 2, No. 4, Dec. 1959.

Lewis, Sr., R. J., Hawley's Condensed Chemical Dictionary, Twelfth Edition, no month, 1993.

Moreau, W. M., "Semiconductor Lithography Principles, Practices and Materials", Plenum Press, New York, 1988. No month.

Mittal, K. L. et al., "Vapor Deposited Adhesion Promoters", IBM Technical Disclosure Bulletin, vol. 17, No. 12, May 1975.

Romankiw, R., et al., "Magnetic Materials, Processes and Devices", Electrochemical Society, Inc., vol. 90–8. No date.

Christenson, T. R., et al., "Micromechanics for Actuators", SPIE vol. 2220, pp. 39–47. No date.

Lochel, B. et al., "Galvanoplated 3D Structures for Micro Systems", Microelectronic Engineering 23 (1994) 455–459, Elsevier. No month.

Gobet, J. et al., "Electrodeposition of 3D Microstructures on Silicon", J. Micromech. Microeng. 3 (1993), 123–130. No month.

Gau, J.-S., "Photolithography for Integrated Thin Film Read/Write Heads", SPIE vol. 1088 Optical/Laser Microlithography II (1989). No month.

Phillips, W. A. et al., "Fluid Control Devices", IEE Colloquium (Digest) n 069 Mar. 15, 1994.

Lochel, B., "Fabrication of Magnetic Microstructures by Using Thick Layer Resists", Microelectronic Engineering 21 (1993) 463–466. No month.

*Primary Examiner*—John Niebling
*Assistant Examiner*—Edna Wong
*Attorney, Agent, or Firm*—Robert B. Martin

[57] ABSTRACT

A process for patterned electroplating involves the steps of: (i) coating a substrate with a layer of hydroxyquinoline which acts as an adhesion promoter; (ii) coating the adhesion layer with a radiation sensitive polymeric resist; (iii) imagewise exposing the film to radiation; (iv) developing the image to patternwise expose the substrate; (v) electroplating metal onto the exposed portions of the substrate; and (vi) removing the remaining polymeric film from the substrate.

7 Claims, 1 Drawing Sheet

PATTERNED ELECTROPLATING

The present invention relates to a process for patterned electroplating use in the manufacture of thin film magnetic heads.

BACKGROUND OF THE INVENTION

Patterned electroplating is used in micromechanical structure fabrication, such as for microactuators and magnetic micromotors. Patterned electroplating is also used in the manufacture of thin film inductive heads used in magnetic recording systems, such as disk drives. Patterned electroplating generally involves electroplating a substrate through a patterned photosensitive polymeric resist film disposed on the substrate. Generally, a photosensitive diazonaphthoquinone-novolac resist is used in the plating process. However, a continuing problem in the industry is delamination of the resist film and underplating during the electroplating process. This problem is pronounced in the manufacture of inductive heads due to the adhesion problem of photoresist to nickel/iron alloy.

It is therefore an object of the present invention to provide a patterned electroplating process which is resistant to delamination and is readily strippable after the plating process. Other objects and advantages will be apparent from the following disclosure.

SUMMARY OF THE INVENTION

The present invention relates to an improved process for patterned electroplating. The process generally involves the steps of: (i) coating a substrate with a layer of hydroxyquinoline which acts as an adhesion promoter; (ii) coating onto the adhesion layer a film of radiation sensitive polymeric resist; (iii) patternwise exposing the film to radiation; (iv) developing the film to patternwise expose the substrate; (v) electroplating metal onto the exposed portions of the substrate; and (vi) removing the remaining polymeric film from the substrate.

The adhesion promoter minimizes delamination of the resist film and underplating during the process.

A more through disclosure of the present invention is presented in the detailed description which follows and the accompanying drawings.

DETAILED DESCRIPTION OF THE INVENTION

Figure 1:
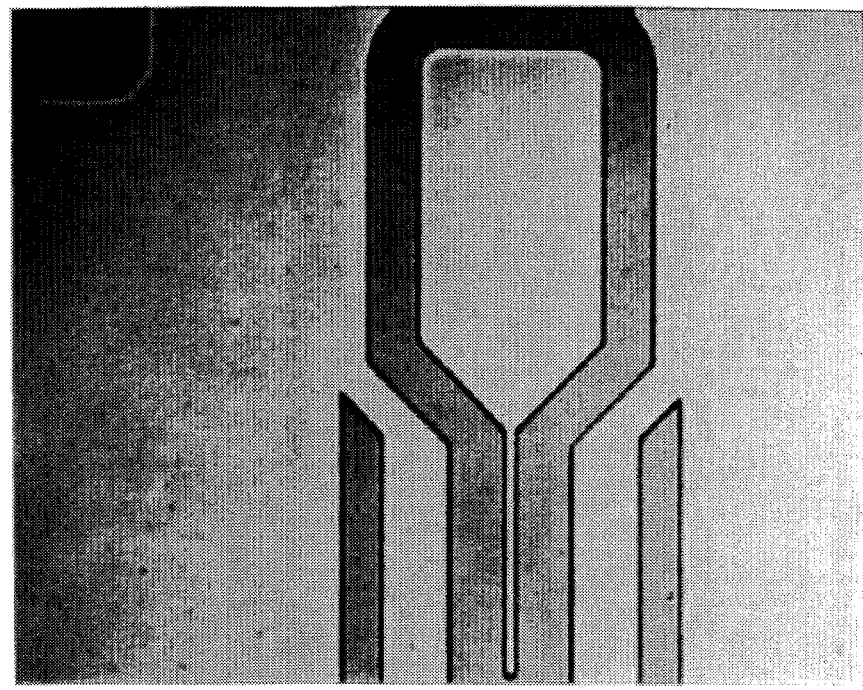
FIG. 1 is an optical micrograph of an electroplated permalloy pattern.

The present invention relates to a process for patterned electroplating onto a substrate. Suitable substrates for use in the process include both electrically conductive and nonconductive substrates. In one embodiment of the process, the substrate is electrically conductive metal or metal alloy such as nickel/iron alloy (e.g. permalloy). However, in microelectronic applications, the substrate is nonconductive such as ceramic, silicon or polymer. For nonconductive substrates, a metallic, electrically conductive seed layer is deposited onto the substrate to enable electroplating onto a metallized substrate. The seed layer can be deposited by vacuum evaporation or sputtering. The seed layer is preferably a metal alloy, preferably nickel/iron alloy and most preferably 50:50 nickel/iron alloy.

The first step of the process of the present invention involves coating the substrate with the adhesion promoter, hydroxyquinoline. The preferred hydroxyquinoline is 8-hydroxyquinoline. However, other hydroxyquinolines will also be suitable in the process of the present invention. The hydroxyquinoline can be substituted by substituents which do not unacceptably interfere with the adhesion activity of the hydroxyquinoline and these compounds are contemplated as equivalents of those claimed herein. Conveniently, the hydroxyquinoline is dissolved in a suitable solvent such as ethyl ethoxypropionate, ethyl lactate, diacetone alcohol, or propylene glycol monomethylether acetate. The hydroxyquinoline can then be coated onto the substrate using known techniques such as spin or spray coating. The adhesion layer is then preferably dried by heating to an elevated temperature of about 90° to 120° C. for a short time, preferably about 95° C. for about 10 minutes. The hydroxyquinoline can also be vapor deposited onto the substrate.

The second step of the process involves coating the adhesion layer with a resist composition. A suitable resist composition comprises two components. The first component is a resin binder, preferably a phenolic resin binder. Suitable phenolic resins include polyhydroxystyrene, carbon and oxygen alkylated derivatives and novolacs. Suitable novolacs are resins from an aldehyde such as acetaldehyde or formaldehyde, with a phenol such as phenol itself, or phenol substituted with 1 or 2 alkyl groups of 1 to 9 carbon atoms each, e.g., o-, m-, and p-cresol, the xylenols, p-tert-butyl phenol, and p-nonylphenol, p-phenyl-phenol, resorcinol, bis(4-hydroxyphenyl)methane and 2,2-bis(4-hydroxyphenyl) propane. The preferred phenolic resin is novolac. Suitable phenolic resins are commercially available. Polyimides are also suitable resin binders.

The second component of the resist composition is diazoketone dissolution inhibitor. The preferred inhibitor is a diazonaphthoquinone, preferably is 4-diazonaphthoquinone. Other suitable diazonaphthoquinones will be known to those skilled in the art. Optionally, the resist composition can contain additives such as plasticizers to lower the glass transition temperature of the film, and also polymers and small molecules to adjust the film dissolution rate, electrobath resistance, optical density, radiation sensitivity, and the like. Suitable additives include antireflective dyes. The preferred resist is SJR 3440 by Shipley Company. Other suitable resin compositions will be known to those skilled in the art.

The resist composition is dissolved in a suitable solvent such as those used for the hydroxyquinoline. The composition can then be coated on the adhesion layer using spin or spray coating, or doctor blading. Preferably, before the film is exposed to radiation, the film is heated to an elevated temperature of about 80–120° C. (e.g. 100° C.) for a short period of time of about 20 to 30 minutes. The dried film has a thickness of about 1–75 microns, depending on the application. The preferred thickness is about 4–8 microns.

In the third step of the process, the resist film is patternwise exposed to radiation, such as electron beam or electromagnetic, preferably ultraviolet radiation at a wavelength of about 190–450 nm (preferably 350–450 nm). Suitable radiation sources include excimer laser, mercury, mercury/xenon, and xenon lamps, X-ray or E-beam. The preferred radiation sources are mercury or mercury/xenon lamps. The film can be patternwise exposed through a lithographic mask or by laser direct write.

The fourth step involves development of the radiation pattern in the film with a suitable developer solvent. Suitable solvents include an aqueous base, preferably an aqueous base with or without metal ions preferably with metal ions such as potassium hydroxide, sodium hydroxide, tetramethyl ammonium hydroxide, ammonium hydroxide or choline. The development step patternwise exposes portions of the underlaying substrate.

The fifth step of the process involves electroplating metal onto the portions of the substrate which have been exposed in the development step. As used herein, metal includes both metals and metal alloys. A suitable electroplating process is the Wolf bath such as disclosed in Anderson et. al. U.S. Pat. No. 4,279,707, the disclosure of which is incorporated herein by reference. Suitable metals for plating in the process of the present invention include nickel, iron, copper, gold, silver, cadmium, cobalt, permalloy (preferably 50:50 nickel/iron) and nickel/iron/cobalt alloy. Other suitable metals will be known to those skilled in the art. Suitable metal salts include borate, chloride, sulfate, fluoride and cyanide salts. The preferred metal is permalloy. Preferred salts are nickel chloride, nickel sulfate and ferrous sulfate. A suitable permalloy electroplating bath comprises:

Nickel Ion Concentration=10 to 14 g/l

Boric Acid=0.3 to 0.5 Molar

Electrolyte such as sodium chloride=0.3 to 0.5 Molar

Iron (Ferrous) Ion Concentration=0.1 to 1.0 g/l

Optionally, the bath can contain surfactants.

The patterned film is immersed in the aqueous electroplating solution bath. The aqueous bath has a pH of about 2 to 3.5 and a temperature of about 15° to 40° C.

The substrate is electroplated through the resist mask. A potential of about 4–15 milliamps/cm$^2$ is applied on the cathode and the substrate is electroplated for a period of time depending on the desired amount of deposition. During the electroplating process, the resist continues to adhere to the substrate to avoid underplating.

After the metal has been plated onto the substrate to form microstructures, the patterned resist composition remaining on the substrate is removed. The resist composition can be stripped from the substrate by dissolving it in a solvent such as acetone or N-methylpyrrolidinone for a short period of time e.g. about 5 minutes.

After the resist composition has been removed, nonconductive substrates can optionally be etched with ammonium persulfate/protic acid or aqueous sulfuric acid/HF to remove the seed layer and thereby electrically isolate the microstructure on the substrate.

The process of the present invention can be utilized in the manufacture of thin film heads. Thin film magnetic heads and the process for making thin film magnetic heads are well known in the art, such as disclosed in U.S. Pat. No. 4,652,954, the disclosure of which is incorporated herein by reference. The first step of the process involves forming the bottom magnetic pole piece. The bottom pole piece is formed by first metallizing a nonmagnetic ceramic substrate with a thin film (seed layer) of metal alloy, such as NiFe, deposited by vacuum evaporation or sputtering. The pole piece is then formed by patterned electroplating through a photoresist mask onto the metallized seed layer in accordance with the process of the present invention.

The following examples are detailed descriptions of the present invention. The detailed descriptions fall within the scope of, and serve to exemplify, the more generally described invention set forth above. The examples are presented for illustrative purposes only, and are not intended as a restriction on the scope of the invention.

EXAMPLES

Figure 2:
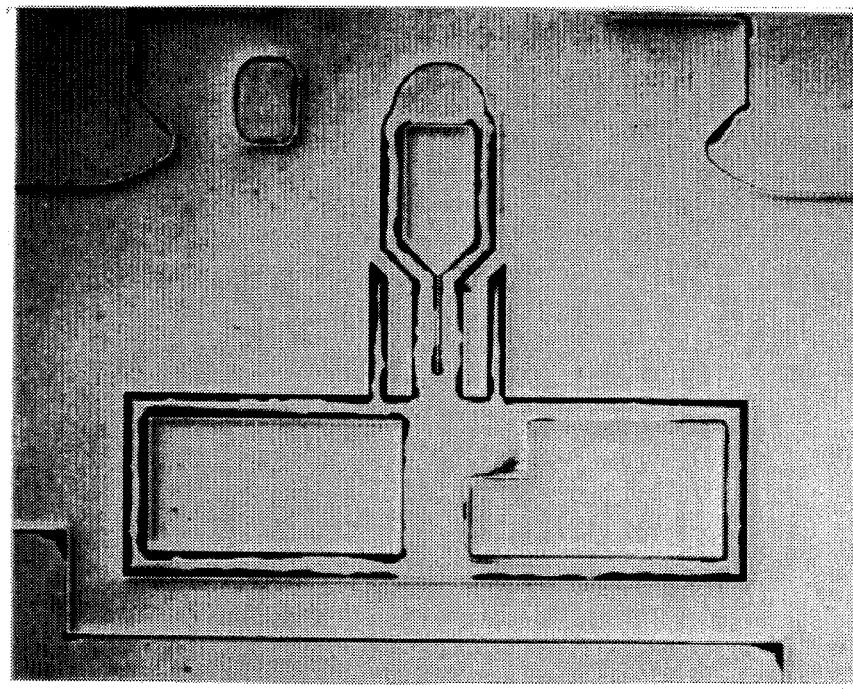
FIG. 2 is an optical micrograph of an electroplated permalloy pattern.

Two silicon wafers were processed in identical fashion to determine the effect of the adhesion promoter on electroplating. Each wafer comprised a silicon substrate to which a metallic seed layer consisting of 80 parts nickel and 20 parts iron was vacuum deposited to a thickness of approximately 0.1 micrometer. One of the two substrates was treated with the adhesion promoter solution which consisted of 0.1% (by weight) of 8-hydroxyquinoline (HQ) dissolved in propylene glycol monomethyl ether acetate. The adhesion promoter solution was allowed to stand in contact with the substrate for one minute and then spun dry at 3000 rpm for 20 seconds. The substrate was then baked at 105° C. for 10 minutes. Both substrates were then coated with a five micrometer thick photoresist film (SJR 3440, Shipley Company) by spin coating followed by baking at 95° C. for 20 minutes to remove excess photoresist solvent. The films were then exposed to 365/404 nm radiation with a Perkin Elmer 600 scanning projection exposure tool through a lithographic mask containing the plating frame pattern. The resist images were then developed by immersion in solution of diluted commercial photoresist developer (1:6 Microposit 2401 developer to water) for 16 minutes. The wafers were rinsed with deionized water. The two wafers were then electroplated in a Wolf bath with 2 micrometer thicknesses of nickel-iron alloy (50:50). The photoresist was stripped by immersion in N-methylpyrrolidinone for several minutes at 60° C. The completed wafers were examined by optical microscopy. In FIG. 1, the HQ-treated wafer showed little or no evidence of underplating inside the stripped areas. In FIG. 2, the untreated wafer showed massive underplating with loss of pattern integrity inside the stripped areas.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. A process for forming a thin film magnetic head comprising:

(i) forming a layer of hydroxyquinoline on a metallized substrate;

(ii) coating the layer with a radiation sensitive polymeric film;

(iii) patternwise exposing the polymeric film to radiation;

(iv) developing the film to patternwise expose the substrate;

(v) electroplating metal onto the exposed portions of the substrate; and (vi) removing remaining polymeric film from the substrate to form the magnetic head.

2. The process of claim 1 wherein the substrate is metallized with nickel/iron alloy.

3. The process of claim 2 wherein the metal is nickel/iron alloy.

4. The process of claim 3 wherein the radiation sensitive polymeric film comprises novolac and diazonaphthoquinone.

5. The process of claim 4 wherein the hydroxyquinoline is 8-hydroxyquinoline.

6. The process of claim 5 wherein the metal forms a pole piece of the thin film magnetic head.

7. The process of claim 2 further including the step of etching the substrate.

* * * * *